United States Patent
Canilao et al.

(10) Patent No.: US 7,057,461 B1
(45) Date of Patent: Jun. 6, 2006

(54) HETEROSTRUCTURE BIPOLAR TRANSISTOR POWER AMPLIFIER MODULE WITH DYNAMIC VOLTAGE SUPPLY FOR IMPROVED EFFICIENCY

(75) Inventors: Alzon B. Canilao, Union City, CA (US); Ronald P. Green, Santa Clara, CA (US); Gi Young Lee, Saratoga, CA (US)

(73) Assignee: Dynalinear Technologies, Inc., Campbell, CA (US)

( * ) Notice: Subject to any disclaimer, the term of this patent is extended or adjusted under 35 U.S.C. 154(b) by 0 days.

(21) Appl. No.: 10/804,974

(22) Filed: Mar. 18, 2004

Related U.S. Application Data

(60) Provisional application No. 60/456,423, filed on Mar. 19, 2003.

(51) Int. Cl.
*H03G 3/10* (2006.01)
(52) U.S. Cl. .................................. 330/285; 330/296
(58) Field of Classification Search ................ 330/285, 330/288, 296, 297
See application file for complete search history.

(56) References Cited

U.S. PATENT DOCUMENTS

| | | | |
|---|---|---|---|
| 6,052,032 A * | 4/2000 | Jarvinen | 330/289 |
| 6,404,287 B1 | 6/2002 | Dening et al. | 330/296 |
| 6,456,163 B1 * | 9/2002 | Luo et al. | 330/288 |
| 6,518,840 B1 * | 2/2003 | Rahn et al. | 330/149 |
| 6,549,076 B1 * | 4/2003 | Kuriyama | 330/296 |
| 6,617,928 B1 | 9/2003 | Finlay et al. | 330/288 |
| 6,771,129 B1 | 8/2004 | Riishoj et al. | 330/285 |
| 6,784,748 B1 | 8/2004 | Canyon et al. | 330/296 |
| 6,803,821 B1 | 10/2004 | DeFalco et al. | 330/288 |
| 6,842,075 B1 | 1/2005 | Johnson et al. | 330/296 |
| 2002/0063601 A1* | 5/2002 | Yamamoto et al. | 330/289 |

* cited by examiner

*Primary Examiner*—Robert Pascal
*Assistant Examiner*—Hieu Nguyen
(74) *Attorney, Agent, or Firm*—Fenwick & West LLP

(57) ABSTRACT

A power amplifier comprises first and second power transistor stages that receive first and second supply voltages, respectively. First and second bias circuits provide the biasing for the first and second power transistor stages, respectively, in response to a reference voltage and a bias voltage.

8 Claims, 3 Drawing Sheets

HETEROSTRUCTURE BIPOLAR TRANSISTOR POWER AMPLIFIER MODULE WITH DYNAMIC VOLTAGE SUPPLY FOR IMPROVED EFFICIENCY

CROSS-REFERENCE TO RELATED APPLICATIONS

This application claims the benefit of U.S. Provisional Application No. 60/456,423, filed Mar. 19, 2003, which is incorporated herein by reference.

BACKGROUND

The invention relates to a heterostructure bipolar transistor power amplifier module, and more particularly to a power amplifier module with a dynamic voltage supply.

As the wireless industry for handheld phones matures, it is insufficient for a power amplifier module (PAM) to meet a specification at a low cost, and with a small footprint while accepting whatever power efficiency at power back-off occurs once the efficiency is optimized at maximum power. The power efficiency drops dramatically with lower output power due to the impedance mismatch between the constant low impedance output match and the rising impedance of the output stage. This is of particular importance with Code Division Multiple Access (CDMA) technology, because in CDMA the probability of the output power is the greatest between 12 to 18 dB power back-off from a nominal maximum and falls to a minimum at either a maximum or minimum power limit.

A simple yet popular approach for improving power efficiency in the power back-off high probable area is to change the 'mode' of operation of the amplifier. By moving the 'mode of operation' to more of a class B amplifier from a class A amplifier, the efficiency improves. This is achieved by lowering the quiescent current through the RF stages using a simple switch in the DC bias circuitry. The amplifier is switched between states or modes at a 8 to 12 dB back-off, and the efficiency improvement is typically a few percent.

Another approach is to use a DC—DC converter for the main power supply for the power amplifier. Reducing the collector supply voltage(s) when the PAM output requirement is at a lower power level can result in a much higher efficiency improvement, by 100 to 300% (depending on the power level), because the output transistor impedance stays relatively constant with lower power as the supply voltage is also lowered. However, for most HBT amplifiers, this approach only works in the collector voltage range of 4 Volts down to about 1.5 Volts. At best, the output stage collector voltage (Vcc2 for a two stage amplifier) may be reduced to below 1.5 Volts. This limits the useful dynamic output power range to about 10 dB.

FIG. 1 shows the probability distribution function of the transmission power of handheld phone for CDMA for urban areas and a data mode. It can be seen that PAM works only 4% of the time in its enhanced efficiency state whereas the PAM works about 17% of the time in the data mode.

SUMMARY

A power amplifier module includes first and second RF stages and first and second bias circuits for the first and second RF stages, respectively. Power is supplied to the bias circuits separately from the power supplied to the first and second RF stages.

In one aspect, the first and second RF stages are powered by first and second voltages Vcc1 and Vcc2, respectively. A voltage Vref sets a bias point of the first and second bias circuits. A voltage Vcb powers the first and second bias circuits. The voltage Vcb is provided to the power amplifier module separately from the first and second voltages Vcc1 and Vcc2.

DETAILED DESCRIPTION

To take full advantage of the DC—DC switching supply voltage for CDMA applications, the power amplifier module of the present invention may operate over a supply voltage range that equates to a 20 to 25 dB power range. With this range, the power amplifier module operates at high efficiency 28% of the time for urban areas and at about 65% of the time for a data mode. In one embodiment, the power amplifier module should operate down to approximately 0.5 Volt supply to achieve this dynamic range for high efficiency.

Figure 1:
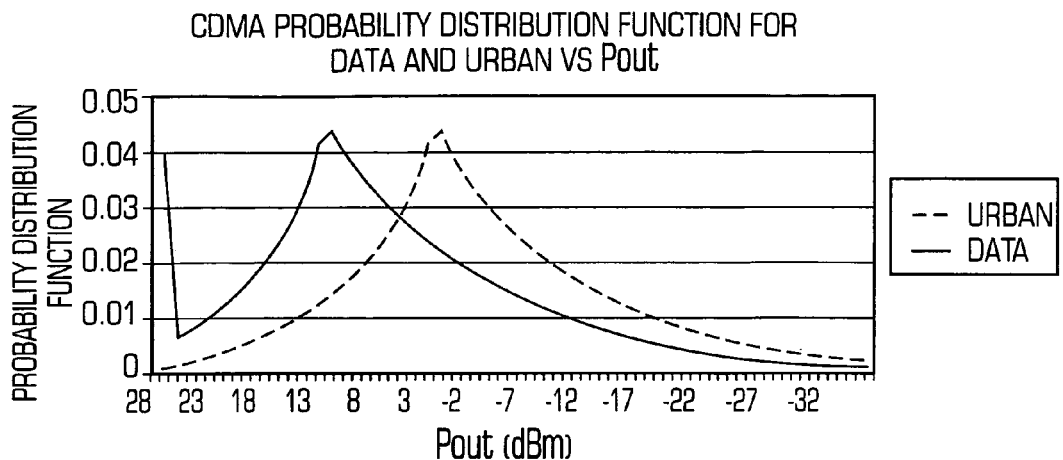
FIG. 1 is a graph illustrating an output power probability distribution function for urban usage and for a data transmission mode for a CDMA system.
Figure 2:
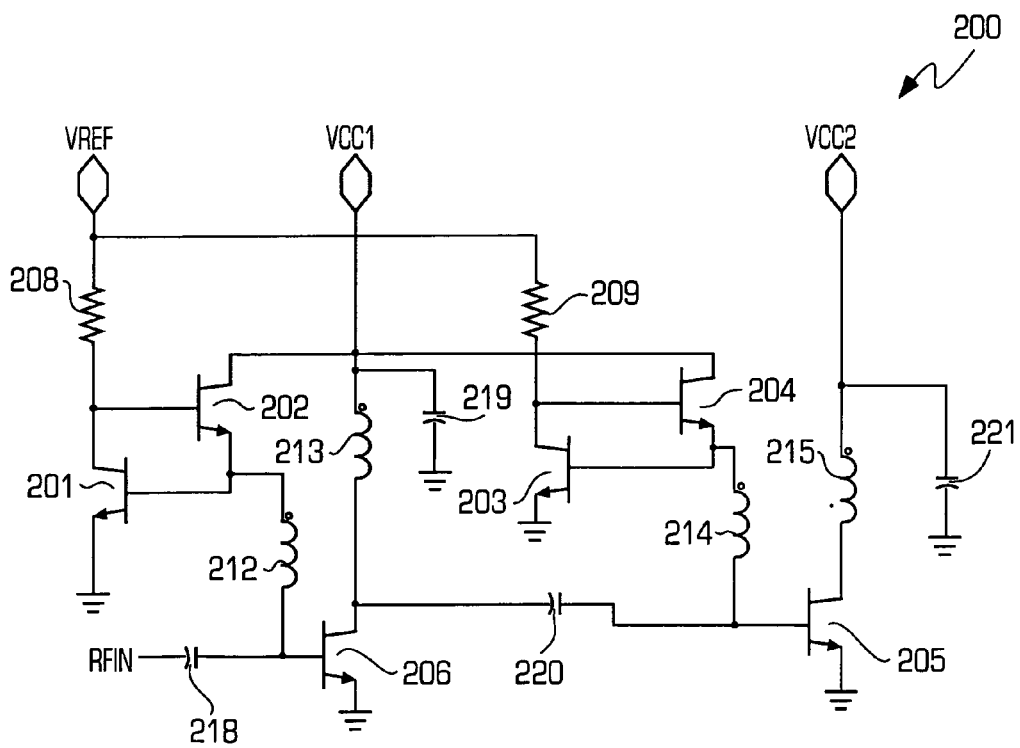
FIG. 2 is a schematic diagram illustrating a conventional power amplifier module bias circuit.

FIG. 2 is a schematic diagram illustrating a conventional power amplifier module bias circuit 200.

The power amplifier module 200 comprises a plurality of transistors 201 through 206, a plurality of resistors 208 and 209, a plurality of inductors 212 through 215, and a plurality of capacitors 218 through 221. A first stage of the power amplifier 200 includes the transistor 206, the inductor 213, and the capacitor 219. A bias circuit for the first stage of the power amplifier 200 include the transistors 201 and 202, the resistor 208, and the inductor 212. A second stage of the power amplifier 200 includes the transistor 205, the inductor 215, and the capacitor 221. A bias circuit for the second stage of the power amplifier 200 include the transistors 203 and 204, the resistor 209, and the inductor 214.

Figure 3:
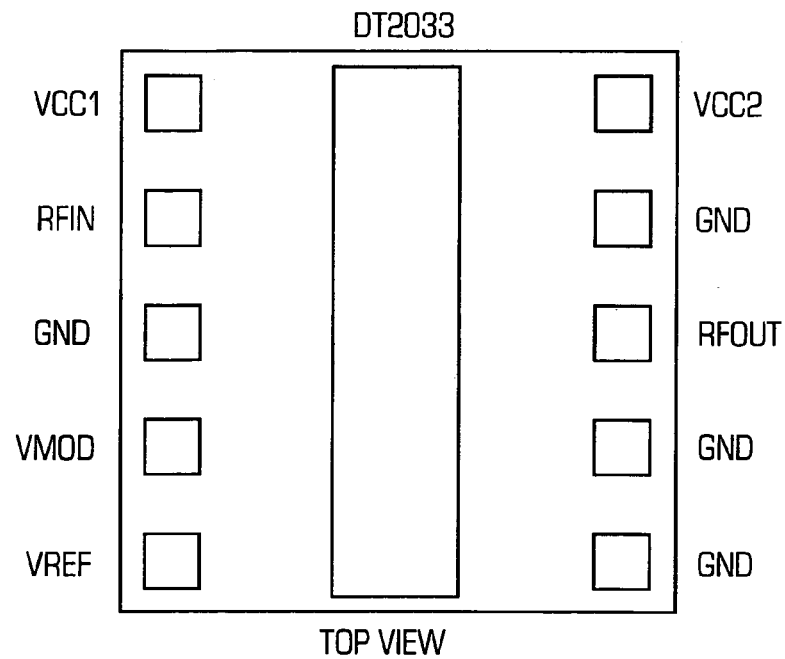
FIG. 3 is a top plan view illustrating a conventional 4 millimeter by 4 millimeter power amplifier module package and pinout.

FIG. 3 is a top plan view illustrating the package and pinout of the power amplifier module 200.

Three separate voltages set the bias or operating condition amplifier. A voltage Vcc1 sets the voltage of the first stage. A voltage Vcc2 sets the voltage of the second stage. A reference voltage Vref sets voltage of the bias circuits and thus sets the quiescent current of the amplifier. Each voltage is controlled separately from a corresponding pin in the module as shown in FIG. 3.

The bias circuitry of the HBT PAM 200 includes a voltage Vcb being coupled to the voltage Vcc of the first stage (Vcc1). When the HBT PAM 200 operates at low collector voltages (Vcc1 and Vcc2), the bias supply adversely affects the RF operation if the voltage Vcb falls below about 1.4 volts. The voltage Vcb is the voltage level at the collectors of the transistors 202 and 204. Coupling the voltage Vcb to the voltage Vcc of the first stage (Vcc1), as shown in FIG. 2, is done to match the industry standard PAM pin configuration shown in FIG. 3.

Figure 4:
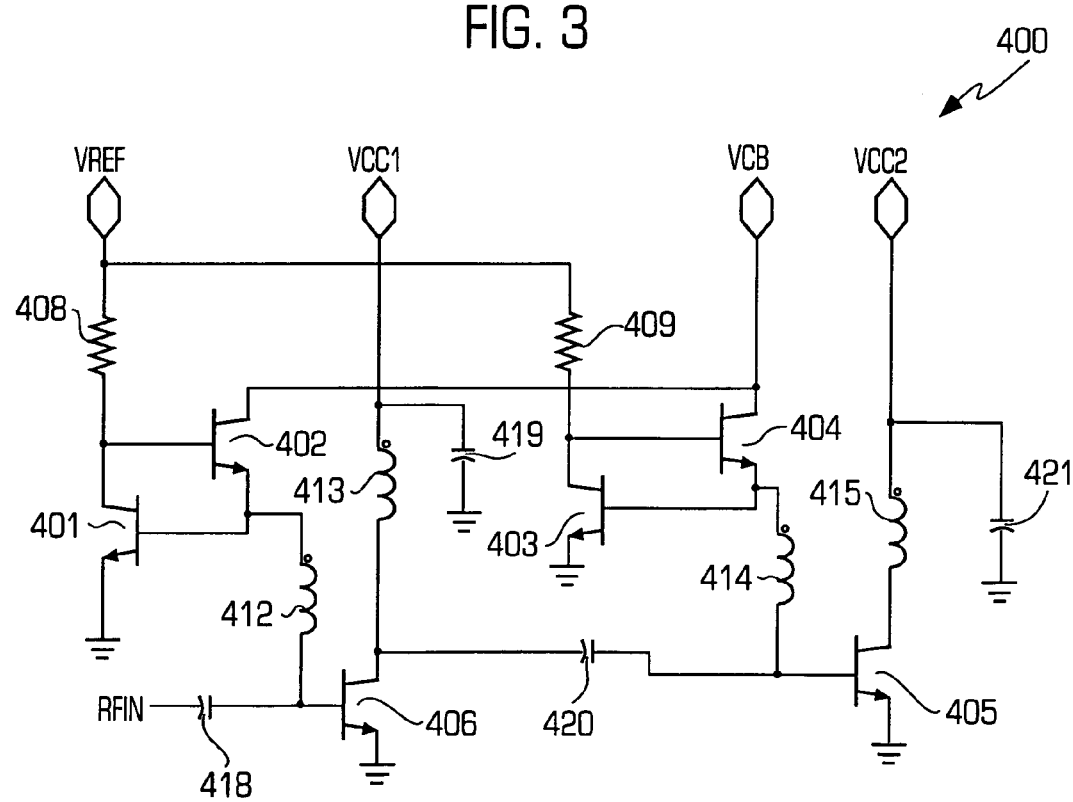
FIG. 4 is a schematic diagram illustrating a power amplifier module bias circuit.
Figure 5:
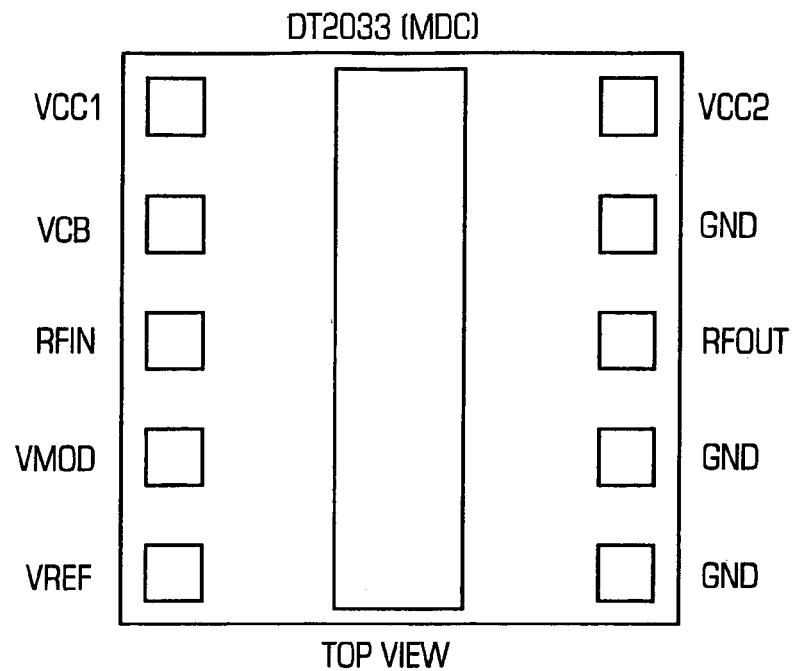
FIG. 5 is a top plan view illustrating a power amplifier module package and pinout for the circuit of FIG. 4.

FIG. 4 is a schematic diagram illustrating a power amplifier module bias circuit 400. FIG. 5 is a top plan view of the package and pinout of the power amplifier module 400.

The power amplifier module 400 comprises a plurality of transistors 401 through 406, a plurality of resistors 408 and 409, a plurality of inductors 412 through 415, and a plurality of capacitors 418 through 421. A first stage of the power amplifier 400 includes the transistor 406, the inductor 413, and the capacitor 419. A bias circuit for the first stage of the power amplifier 400 include the transistors 401 and 402, the resistor 408, and the inductor 412. A second stage of the power amplifier 400 includes the transistor 405, the inductor 415, and the capacitor 421. A bias circuit for the second stage of the power amplifier 400 include the transistors 403 and 404, the resistor 409, and the inductor 414.

Four separate voltages set the bias or operating condition amplifier. A voltage Vcc1 sets the voltage of the first stage. A voltage Vcc2 sets the voltage of the second stage. A reference voltage Vref sets voltage of the bias circuits and thus sets the quiescent current of the amplifier. A voltage Vcb sets the voltage of the bias circuits. Each voltage is controlled separately from a corresponding pin in the module as shown in FIG. 5.

The power amplifier 400 is similar to the power amplifier 200 with the elements 401 through 421 being similarly connected as elements 201 through 221, except for the connection of the collectors of the transistors 402 and 404. In the power amplifier module 200, the collectors of the transistors 202 and 204 are coupled together and to the voltage source Vcc1. In the power amplifier 400, the collectors of the transistors 402 and 404 are coupled to the voltage Vcb. The pinout of the power amplifier module 400 has been modified so that a "spare" ground pad (main ground is the center island) of the power amplifier 200 shown in FIG. 3 now couples to the voltage Vcb as shown in FIG. 5. In the arrangement of the power amplifier module 400, the voltage Vcb is held at 2.5 volts or higher, such as the battery voltage, and the voltages Vcc1 and Vcc2 are controlled down to a voltage of 0.5 volts.

In another embodiment, the voltage Vcb can be connected to the Vref terminal, which, for example, may be kept at a voltage of 2.7V or higher at all times. In this configuration, a pin configuration that is the same as shown in FIG. 3 may be used with the new bias circuitry with this invention, provided that the total current at Vref terminal meets system specification. This embodiments allows a package pin configuration to remain constant, but with different connections inside the package.

Figure 6:
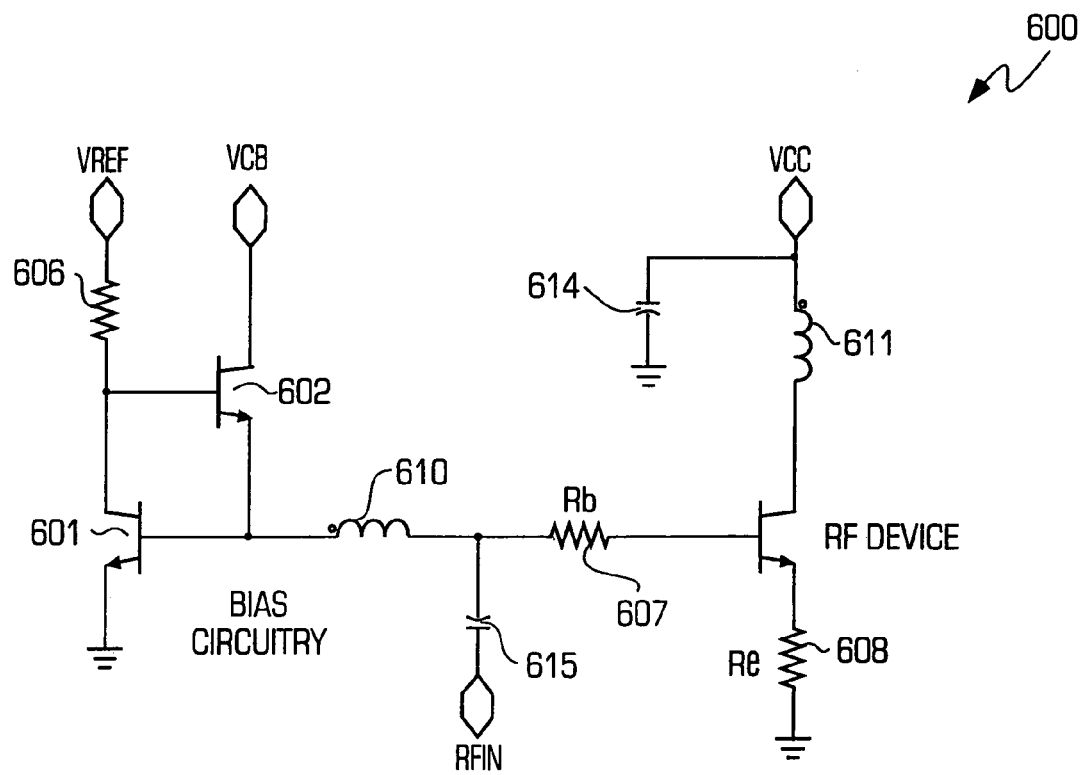
FIG. 6 is a schematic illustrating a power amplifier module including an emitter resistor and a base resistor.

FIG. 6 is a schematic diagram illustrating a power amplifier module 600 including an emitter resistor and a base resistor.

A power amplifier 600 comprises a plurality of transistors 601 through 603, a plurality of resistors 606 through 608, a plurality of inductors 610 and 611, and a plurality of capacitors 614 and 615. The power amplifier 600 may further comprise a plurality of parallel transistor fingers that each include a transistor 603, an inductor 611, a capacitor 614, and a resistor 608 coupled together in parallel.

Another area that will limit low voltage operation is in using emitter ballast resistors for ensuring proper current sharing among all the parallel transistor fingers. The emitter resistor 608 also has a voltage drop and thus limits the lowest voltage that can be applied to the collector of the transistor 603 and still maintain proper linear operation.

In one embodiment, the emitter resistor 608 is removed (or has a zero resistance). By using the base resistor 607 instead of the emitter resistor 608, the base resistor 607 also allows proper current sharing of the parallel transistors but is not in line with the collector current and allows all the supply voltage across the RF transistor 603.

What is claimed is:

1. A power amplifier comprising:
   first and second power transistor stages receiving first and second collector supply voltages, respectively, the first power transistor stage comprising a first RF transistor operating in response to the first collector supply voltage applied to a collector thereof and including a base biased by a first bias voltage, the second power transistor stage comprising a second RF transistor operating in response to the second collector supply voltage applied to a collector thereof and including a base biased by a second bias voltage; and
   a first stage bias circuit including first and second bias transistors and a second bias circuit including third and fourth bias transistors for providing the respective first and second bias voltages, collectors of the second and fourth bias transistors being biased by a third supply voltage and collectors of the first and third bias transistors operating in response to a fourth supply voltage.

2. The power amplifier of claim 1 wherein the third supply voltage is independent of the first and second collector supply voltages.

3. The power amplifier of claim 2 further comprising a first housing including first, second, third and fourth terminals, the first terminal being coupled to receive the first collector supply voltage, the second terminal being coupled to receive the second collector supply voltage, the third and fourth terminals being coupled to receive the third and fourth supply voltages, respectively.

4. The power amplifier of claim 3 wherein the first housing has similar physical characteristics to a second housing of a power amplifier that includes fifth, sixth, seventh and eight terminals disposed on the second housing in a manner similar to the first, second, third and fourth terminals of the first housing, the fifth and sixth terminals coupled to receive fifth and sixth supply voltages, respectively, the seventh terminal coupled to receive an RF signal, the eighth terminal coupled to receive a seventh supply voltage.

5. The power amplifier of claim 1 wherein the third supply voltage is coupled to the fourth supply voltage.

6. A power amplifier comprising:
   first, second, third, fourth, fifth and sixth bipolar junction transistors, each transistor including a collector, a base, and an emitter, the emitters of the first, second, third, and fifth transistors being coupled to a ground node, the collector of the fourth and sixth transistors being coupled to a bias voltage node;
   a first capacitor including a first terminal coupled to an input node and including a second terminal coupled to the base of the first transistor;
   a second capacitor including a first terminal coupled to the collector of the first transistor and including a second terminal coupled to the base of the second transistor;
   a first inductor including a first terminal coupled to a first supply voltage node and including a second terminal coupled to the collector of the first transistor;

a third capacitor including a first terminal coupled to the first terminal of the first inductor and a second terminal coupled to the ground node;

a second inductor including a first teal coupled to a second supply voltage node and a second terminal coupled to the collector of the second transistor;

a fourth capacitor including a first terminal coupled to the first terminal of the second inductor and including a second terminal coupled to the ground node;

a first resistor including a first terminal coupled to a reference voltage node and including a second terminal coupled to the collector of the third transistor and the base of the fourth transistor;

a third inductor including a first terminal coupled to the base of the third transistor and the emitter of the fourth transistor and including a second terminal coupled to the base of the first transistor;

a second resistor including a first terminal coupled to the reference voltage node and including a second terminal coupled to the collector of the fifth transistor and the base of the sixth transistor; and a fourth inductor including a first terminal coupled to the base of the fifth transistor and the emitter of the sixth transistor and including a second terminal coupled to the base of the second transistor.

7. A power amplifier comprising:

first, second, and third bipolar junction transistors, each transistor including a collector, a base, and an emitter, the emitter of the second transistor being coupled to a ground node, the collector of the third transistor being coupled to a bias voltage node;

a first resistor including a first terminal coupled to the emitter of the first transistor and including a second terminal coupled to the ground node;

a first inductor including a first terminal coupled to a supply voltage node and including a second terminal coupled to the collector of the first transistor;

a first capacitor including a first terminal coupled to the first terminal of the first inductor and including a second terminal coupled to the ground node;

a second resistor including a first terminal coupled to the base of the first transistor and including a second terminal;

a second capacitor including a first terminal coupled to an input node and including a second terminal coupled to the second terminal of the second resistor;

a second inductor including a first terminal coupled to the second terminal of the second resistor and including a second terminal coupled to the base of the second transistor and the emitter of the third transistor; and a third resistor including a first terminal coupled to a reference voltage node and including a second terminal coupled to the collector of the second transistor and the base of the third transistor.

8. The power amplifier of claim 1 wherein the first and second bias transistors of the first stage bias circuit are arranged as a current mirror and the third and fourth bias transistors of the second stage bias circuit are arranged as a current mirror.

* * * * *

UNITED STATES PATENT AND TRADEMARK OFFICE
CERTIFICATE OF CORRECTION

| | | |
|---|---|---|
| PATENT NO. | : 7,057,461 B1 | Page 1 of 1 |
| APPLICATION NO. | : 10/804974 | |
| DATED | : June 6, 2006 | |
| INVENTOR(S) | : Alzon B. Canilao, Ronald P. Green and Gi Young Lee | |

It is certified that error appears in the above-identified patent and that said Letters Patent is hereby corrected as shown below:

Column 5,
Line 4, replace "teal" with --terminal--.

Signed and Sealed this

Fifteenth Day of August, 2006

JON W. DUDAS
*Director of the United States Patent and Trademark Office*